US000001543H

United States Statutory Invention Registration [19]

[11] Reg. Number: H1543

[45] Published: Jun. 4, 1996

Wilber et al.

[54] FERROELECTRIC/SILICIDE/SILICON MULTILAYER AND METHOD OF MAKING THE MULTILAYER

[75] Inventors: William Wilber, Neptune; Ahmad Safari, Princeton JCT; Milind Bedekar, Piscataway, all of N.J.

[73] Assignee: The United States of America as represented by the Secretary of the Army, Washington, D.C.

[21] Appl. No.: 15,500

[22] Filed: Feb. 1, 1993

[51] Int. Cl.[6] ..... B32B 9/04

[52] U.S. Cl. ..... 428/446; 428/697; 428/701; 428/702

[58] Field of Search ..... 428/697, 446, 428/701, 702

[56] References Cited

U.S. PATENT DOCUMENTS

| | | | |
|---|---|---|---|
| 5,053,917 | 10/1991 | Miyasaka et al. | 361/321 |
| 5,070,385 | 12/1981 | Evans, Jr. et al. | 357/57 |
| 5,099,305 | 3/1992 | Takenaka | 357/51 |
| 5,122,923 | 6/1992 | Matsubara et al. | 361/321 |

*Primary Examiner*—Charles T. Jordan
*Assistant Examiner*—John R. Hardee
*Attorney, Agent, or Firm*—Michael Zelenka; Roy E. Gordon

[57] ABSTRACT

A ferroelectric/silicide/silicon multilayer is made by a method including the steps of (A) depositing a layer of cobalt or nickel on a silicon substrate, (B) annealing the silicon substrate in an inert atmosphere at a temperature of about 750° C. to form a layer of cobalt silicide or nickel silicide on top of the silicon, and (C) depositing a ferroelectric layer onto the silicide layer.

4 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FERROELECTRIC/SILICIDE/SILICON MULTILAYER AND METHOD OF MAKING THE MULTILAYER

GOVERNMENT INTEREST

The invention described herein may be manufactured, used and licensed by or for the Government for governmental purposes without the payment to us of any royalty thereon.

FIELD OF INVENTION

The invention relates in general to a thin film deposition of ferroelectric materials and in particular to a ferroelectric/silicide/silicon multilayer and to a method of making the multilayer.

BACKGROUND OF THE INVENTION

For the successful development of a ferroelectric thin film, one must be able to epitaxially grow the ferroelectric on some type of substrate. For measuring the electrical properties of a ferroelectric thin film or for the design of any device that employs a ferroelectric thin film one must be able to deposit the thin film onto a material suitable as an electrode and referred to here as the bottom electrode. A second electrode can then be deposited on top of the ferroelectric film, There has been difficulty in promoting epitaxial growth of the film while simultaneously providing a bottom electrode,

SUMMARY OF THE INVENTION

The general object of this invention is to provide a ferroelectric thin film multilayer for use in any electronic device that employs ferroelectric thin films such as sensory elements or capacitors. A more specific object of the invention is to provide a barrier layer between the ferroelectric film and a silicon substrate that will also serve as an electrode. A still further object of the invention is to provide a barrier for epitaxial growth of ferroelectric on silicon and also serve as the bottom electrode for any ferroelectric device fashioned from the thin film material.

It has now been found that the aforementioned object can be attained by using a cobalt silicide ($CoSi_2$) or nickel silicide ($NiSi_2$) barrier layer to promote epitaxial growth and to serve as the bottom electrode,

DESCRIPTION OF THE PREFERRED EMBODIMENT

Figure 1:
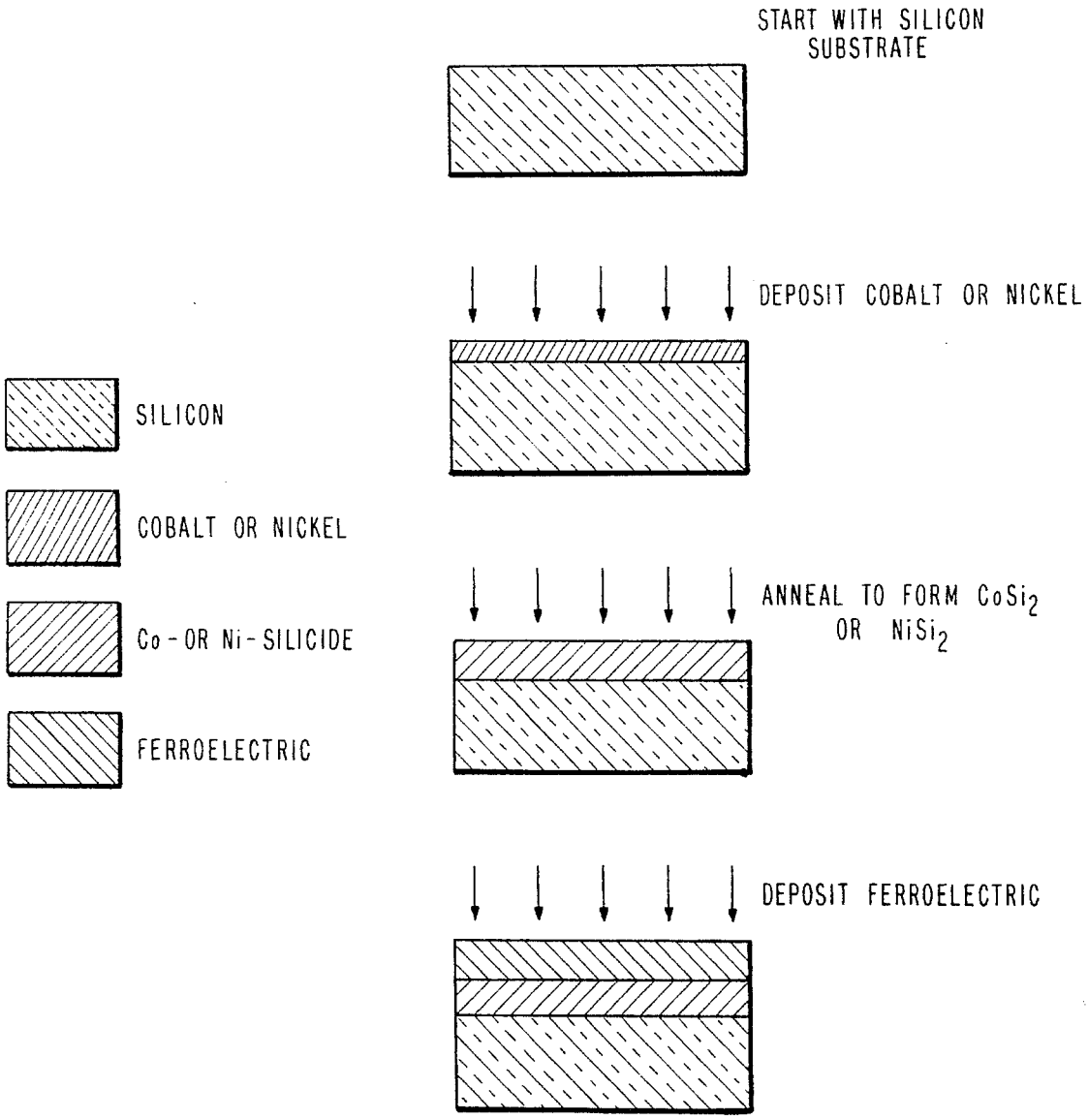
FIG. 1 illustrates schematically how one would form the Co- or Ni- silicide/ferroelectric multilayer structure.

Beginning with a single crystal silicon substrate, a Co or Ni layer is deposited by sputtering, evaporation, laser ablation, or any other suitable means. The substrate is then annealed in an inert atmosphere at a temperature of about 750° C. that is sufficient to form a layer of $CoSi_2$ or $NiSi_2$ on top of the silicon. The cobalt silicide is cubic with a lattice parameter of 5.37A. Nickel silicide is cubic with a lattice parameter of 5.4A. Once the silicide has formed, one may deposit the ferroelectric layer by sputtering, laser ablation, molecular beam epitaxy or any other appropriate means. One ferroelectric material that is particularly appropriate is bismuth titanate ($Bi_4Ti_3O_{12}$) because the lattice parameters are 5.41A (a axis) and 5.45A (b axis). One advantage of the deposition method shown in FIG. 1 is that the formation of the silicide layer during the anneal also acts to eliminate surface impurities such as oxides.

In the aforedescribed method, one may form the silicide layer by methods other than that shown in FIG. 1. As an example, one may deposit the silicide in one step by using molecular beam epitaxy to deposit $CoSi_2$ or $NiSi_2$ directly onto the silicon. This method does not have the advantage of eliminating surface impurities.

In the aforedescribed method, the silicide barrier layer can be formed in the same chamber used to deposit the ferroelectric film. This takes advantage of the fact that when the silicide grows on the silicon; the surface becomes free of many contaminants, particularly oxides. One is then able to deposit a ferroelectric onto a contaminant free surface.

In the ferroelectric/silicide/silicon multilayer of the invention, the silicon substrate is about 250 to 500 microns in thickness, the silicide layer is about 0.02 to 0.2 micron in thickness, and the ferroelectric layer is about 0.1 to 1 micron in thickness.

We wish it to be understood that we do not desire to be limited to the exact details of construction as described for obvious modifications will occur to a person skilled in the art.

What is claimed is:

1. A ferroelectric/silicide/silicon multilayer wherein the silicide is selected from the group consisting of cobalt silicide and nickel silicide.

2. A multilayer according to claim 1 wherein the ferroelectric is bismuth titanate, wherein the silicide is selected from the group consisting of cobalt silicide and nickel silicide and wherein the silicon is single crystal silicon.

3. A multilayer according to claim 2 wherein the silicide is cobalt silicide.

4. A multilayer according to claim 2 wherein the silicide is nickel silicide.

* * * * *